US008686619B2

(12) United States Patent
Tanaka et al.

(10) Patent No.: US 8,686,619 B2
(45) Date of Patent: Apr. 1, 2014

(54) PIEZOELECTRIC ACTUATOR, LIQUID TRANSPORT APPARATUS, AND METHOD FOR PRODUCING PIEZOELECTRIC ACTUATOR

(75) Inventors: Taiki Tanaka, Nagoya (JP); Keiji Kura, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 45 days.

(21) Appl. No.: 13/429,904

(22) Filed: Mar. 26, 2012

(65) Prior Publication Data
US 2013/0084199 A1 Apr. 4, 2013

(30) Foreign Application Priority Data
Sep. 30, 2011 (JP) ................................ 2011-217728

(51) Int. Cl.
*H01L 41/08* (2006.01)
(52) U.S. Cl.
USPC ............................. 310/324; 310/359; 347/68
(58) Field of Classification Search
USPC ............................. 310/324, 348; 347/68–72
See application file for complete search history.

(56) References Cited

U.S. PATENT DOCUMENTS

| 5,376,856 | A | * | 12/1994 | Takeuchi et al. | 310/328 |
| 6,457,222 | B1 | * | 10/2002 | Torii et al. | 29/25.35 |
| 7,287,840 | B2 | * | 10/2007 | Miyazawa et al. | 347/68 |
| 7,348,715 | B2 | * | 3/2008 | Torii et al. | 310/358 |
| 7,905,578 | B2 | * | 3/2011 | Nishi | 347/68 |
| 8,057,018 | B2 | * | 11/2011 | Yazaki et al. | 347/68 |
| 8,491,101 | B2 | * | 7/2013 | Kato et al. | 347/68 |

FOREIGN PATENT DOCUMENTS

JP 2009-241325 A 10/2009

* cited by examiner

Primary Examiner — Mark Budd
(74) Attorney, Agent, or Firm — Baker Botts L.L.P.

(57) ABSTRACT

A piezoelectric actuator is provided, including a piezoelectric layer which is joined to a joining member and which has a coefficient of linear expansion smaller than a coefficient of linear expansion of the joining member; a first electrode which is arranged on one surface of the piezoelectric layer; a second electrode which is arranged on a portion of the one surface of the piezoelectric layer different from the first electrode and which is in conduction with the first electrode; and a low dielectric layer which is formed between the piezoelectric layer and the second electrode and which has a dielectric constant lower than a dielectric constant of the piezoelectric layer.

14 Claims, 11 Drawing Sheets

SCANNING DIRECTION

PAPER FEEDING DIRECTION

PIEZOELECTRIC ACTUATOR, LIQUID TRANSPORT APPARATUS, AND METHOD FOR PRODUCING PIEZOELECTRIC ACTUATOR

CROSS REFERENCE TO RELATED APPLICATION

The present application claims priority from Japanese Patent Application No. 2011-217728, filed on Sep. 30, 2011, the disclosure of which is incorporated herein by reference in its entirety.

BACKGROUND OF THE INVENTION

1. Field of the Invention

The present invention relates to a piezoelectric actuator, a liquid transport apparatus, and a method for producing the piezoelectric actuator.

2. Description of the Related Art

Conventionally, a piezoelectric actuator is known, which drives an object when an electric field is applied thereto to generate piezoelectric deformation of the piezoelectric actuator. For example, in the case of a piezoelectric actuator for an ink jet head described in Japanese Patent Application Laid-open No. 2009-241325 (FIG. 11), two piezoelectric layers, each of which is composed of a piezoelectric material, are stacked, wherein a common electrode is arranged between the two piezoelectric layers, and a plurality of individual electrodes (first electrodes) are arranged on a surface of one piezoelectric layer. The portion, which is interposed between the common electrode and the individual electrode of one piezoelectric layer, is polarized in the thickness direction to form an active portion, and the other piezoelectric layer functions as a vibration plate. When a voltage is applied between the individual electrode and the common electrode, then the electric field is generated in the thickness direction in the active portion of one piezoelectric layer, and the active portion is piezoelectrically deformed so that the active portion is shrunk in the in-plane direction.

In the meantime, in the case of the piezoelectric actuator for the ink jet head described in Japanese Patent Application Laid-open No. 2009-241325, the piezoelectric layer of the piezoelectric actuator is joined to a plate of a channel unit composed of a metal material by means of a thermosetting adhesive. When the temperature is returned to the ordinary temperature after heating the piezoelectric layer and the channel unit in order to cure the thermosetting adhesive, the compressive stress in the in-plane direction remains in the piezoelectric layer, due to the difference in the coefficient of linear expansion between the both. Further, the deformation amount is decreased in some cases on account of the compressive stress allowed to remain in the piezoelectric layer when it is intended to piezoelectrically deform the active portion of the piezoelectric layer. In view of the above, in the case of the piezoelectric actuator for the ink jet head described in Japanese Patent Application Laid-open No. 2009-241325, an electrode (second electrode) is arranged at a portion of the piezoelectric layer to surround the individual electrode (first electrode), and a voltage is applied to the electrode to effect the polarization in the thickness direction. Thus, the portion of the piezoelectric layer, which surrounds the active portion, is shrunk in the in-plane direction. The active portion is pulled in the in-plane direction in accordance with the shrinkage, and the remaining compressive stress is relaxed or mitigated.

However, the piezoelectric actuator described in Japanese Patent Application Laid-open No. 2009-241325 requires, for example, terminals and wiring lines which are provided to apply the voltage to the second electrodes in order to shrink the portions of the piezoelectric layer facing the second electrodes in the in-plane direction, for example, in addition to terminals and wiring lines which are provided to apply the voltage to the first electrodes in order to apply the electric field to the portions of the piezoelectric layer facing the first electrodes (drive the portions). For this reason, the number of terminals and the number of wiring lines are increased twice, and the structure or arrangement is complicated. If the terminals and the wiring lines are commonly used, the portions of the piezoelectric layer, which face the second electrodes, are also piezoelectrically deformed when the electric field is applied to the portions of the piezoelectric layer which face the first electrodes.

SUMMARY OF THE INVENTION

In view of the above, an object of the present teaching is to provide a piezoelectric actuator wherein no problem arises even when terminals and wiring lines are commonly used, and a portion of a piezoelectric layer, which faces a second electrode, is shrunk in the in-plane direction to relax the compressive stress generated in a portion of the piezoelectric layer which faces a first electrode, as well as a liquid transport apparatus and a method for producing the piezoelectric actuator.

According to a first aspect of the present teaching, there is provided a piezoelectric actuator which is joined to a joining member, including:

a piezoelectric layer which is joined to the joining member and which has a coefficient of linear expansion smaller than a coefficient of linear expansion of the joining member;

a first electrode which is arranged on one surface of the piezoelectric layer;

a second electrode which is arranged on a portion of the one surface of the piezoelectric layer different from the first electrode and which is in conduction with the first electrode; and a low dielectric layer which is formed between the piezoelectric layer and the second electrode and which has a dielectric constant lower than a dielectric constant of the piezoelectric layer.

As described above, when the piezoelectric layer is joined to any joining member having a coefficient of linear expansion larger than that of the piezoelectric layer itself, the compressive stress remains in the in-plane direction in the piezoelectric layer. In this situation, when it is intended to cause the piezoelectric deformation by applying the electric field to the portion (hereinafter referred to as "first portion") of the piezoelectric layer facing the first electrode by applying the voltage to the first electrode, the deformation amount of the first portion of the piezoelectric layer is decreased.

In view of the above, according to the piezoelectric actuator of the present teaching, the second electrode is arranged at the portion of one surface of the piezoelectric layer different from the first electrode. Accordingly, the polarization voltage is applied to the second electrode, and the portion of the piezoelectric layer facing the second electrode (hereinafter referred to as "second portion") is shrunk in the in-plane direction. Thus, the first portion of the piezoelectric layer is pulled in the in-plane direction, and the compressive stress, which has been generated in the first portion of the piezoelectric layer as a result of the joining of the piezoelectric layer, is relaxed or mitigated so that the decrease in the deformation amount can be suppressed.

Further, the first electrode and the second electrode are in conduction. Therefore, when the driving voltage is applied to the first electrode in order to piezoelectrically deform the first portion of the piezoelectric layer, the driving voltage is also applied to the second electrode. However, the low dielectric layer is formed between the second electrode and the piezoelectric layer, and the voltage is concentrated on the low dielectric layer during the application of the driving voltage. Therefore, the voltage is scarcely applied to the second portion of the piezoelectric layer. As a result, the piezoelectric deformation of the second portion of the piezoelectric layer is decreased, and the piezoelectric deformation of the first portion of the piezoelectric layer is hardly inhibited. As described above, the electric field can be applied to only the first portion during the driving. On the other hand, during the polarization, the electric field can be applied to both of the first portion and the second portion. If the first electrode and the second electrode are not in conduction, it is necessary to provide, for example, terminals and wiring lines in order to apply the voltage to the respective electrodes during the driving and during the polarization. However, owing to the fact that the first electrode and the second electrode are in conduction, it is possible to commonly use a number of terminals and a number of wiring lines.

In the piezoelectric actuator of the present teaching, each of the first electrode and the second electrode may be formed of a material including metal particles contained in an insulating material; and the second electrode may be formed of the material in which diameters of the metal particles are larger than those of the first electrode. In this case, as long as the insulating material such as a resin material is included in the material (conductive paste material) for forming the first and second electrode at the production stage, the completed actuator (strictly, the low dielectric layer) do not necessarily have to contain the insulating material. In other words, as long as the insulating material such as a resin material is included in the material for forming the first and second electrodes, the insulating material may be evaporated at the heating step in the production process of the electrodes.

According to a second aspect of the present teaching, there is provided a liquid transport apparatus which transports a liquid, including:

a channel unit in which a liquid channel including a pressure chamber is formed;

a piezoelectric actuator which is arranged on the channel unit and which applies a pressure to the liquid in the pressure chamber; and a joining member to which the piezoelectric actuator is joined, wherein the piezoelectric actuator comprises:

a piezoelectric layer which has a coefficient of linear expansion smaller than a coefficient of linear expansion of the joining member and which is joined to the joining member;

a first electrode which is arranged on one surface of the piezoelectric layer at an area facing the pressure chamber;

a second electrode which is arranged on a portion of the one surface of the piezoelectric layer different from the first electrode, which is formed of a material different from that of the first electrode, and which is in conduction with the first electrode; and a low dielectric layer which is formed between the piezoelectric layer and the second electrode and which has a dielectric constant lower than that of the piezoelectric layer.

As described above, when the piezoelectric layer is joined to any joining member having a coefficient of linear expansion larger than that of the piezoelectric layer itself, the compressive stress remains in the in-plane direction in the piezoelectric layer. In this situation, when it is intended to cause the piezoelectric deformation by applying the electric field to the portion (hereinafter referred to as "first portion") of the piezoelectric layer facing the first electrode by applying the voltage to the first electrode, the deformation amount of the first portion of the piezoelectric layer is decreased. As a result, the transport amount of the liquid is lowered.

In view of the above, according to the liquid transport apparatus of the present teaching, the second electrode is arranged at the portion of one surface of the piezoelectric layer different from the first electrode. Accordingly, the polarization voltage is applied to the second electrode, and the portion of the piezoelectric layer facing the second electrode (hereinafter referred to as "second portion") is shrunk in the in-plane direction. Thus, the first portion of the piezoelectric layer is pulled in the in-plane direction, and the compressive stress, which has been generated in the first portion of the piezoelectric layer as a result of the joining of the piezoelectric layer, is relaxed or mitigated so that the decrease in the deformation amount can be suppressed and the decrease in the transport amount of the liquid can be suppressed.

Further, the first electrode and the second electrode are in conduction. Therefore, when the driving voltage is applied to the first electrode in order to piezoelectrically deform the first portion of the piezoelectric layer, the driving voltage is also applied to the second electrode. However, the low dielectric layer is formed between the second electrode and the piezoelectric layer, and the voltage is concentrated on the low dielectric layer during the application of the driving voltage. Therefore, the voltage is scarcely applied to the second portion of the piezoelectric layer. As a result, the piezoelectric deformation of the second portion of the piezoelectric layer is decreased, and the piezoelectric deformation of the first portion of the piezoelectric layer is hardly inhibited. As described above, the electric field can be applied to only the first portion during the driving. On the other hand, during the polarization, the electric field can be applied to both of the first portion and the second portion. If the first electrode and the second electrode are not in conduction, it is necessary to provide, for example, terminals and wiring lines in order to apply the voltage to the respective electrodes during the driving and during the polarization. However, owing to the fact that the first electrode and the second electrode are in conduction, it is possible to commonly use a number of terminals and a number of wiring lines.

According to a third aspect of the present teaching, there is provided a method for producing a piezoelectric actuator, including:

joining, to a piezoelectric layer, a joining member having a coefficient of linear expansion larger than that of the piezoelectric layer by means of a thermosetting adhesive while being heated;

forming a first electrode on one surface of the piezoelectric layer;

forming a second electrode on the one surface of the piezoelectric layer; and applying a polarization voltage to the first electrode or the second electrode to polarize an area of the piezoelectric layer facing the first electrode or the second electrode.

According to the method for producing the piezoelectric actuator of the present teaching, the compressive stress in the in-plane direction, which remains in the piezoelectric layer in the step of joining the piezoelectric layer and the joining member, is dealt with as follows. That is, it is possible to relax or mitigate the compressive stress generated in the first portion of the piezoelectric layer such that the voltage is applied to the second electrode in the step of polarizing the piezoelectric layer and the portion of the piezoelectric layer facing the second electrode is shrunk in the in-plane direction. Further, the first electrode and the second electrode are in conduction. Therefore, for example, when the polarization voltage is applied to the first electrode or the second electrode after forming the first electrode and the second electrode, it is possible to polarize at once the portion of the piezoelectric layer facing the first electrode and the portion of the piezoelectric layer facing the second electrode. It is possible to simplify the production steps.

The portion of the piezoelectric layer facing the second electrode is shrunk in the in-plane direction by means of the polarization. The portion of the piezoelectric layer facing the first electrode is pulled in the in-plane direction, and the compressive stress, which has been generated in the portion of the piezoelectric layer facing the first electrode as a result of the joining of the piezoelectric layer, is relaxed or mitigated so that the decrease in the deformation amount can be suppressed. Further, the low dielectric layer is formed between the second electrode and the piezoelectric layer, and the voltage is concentrated on the low dielectric layer during the application of the driving voltage. Therefore, the voltage is scarcely applied to the second portion of the piezoelectric layer. As a result, the piezoelectric deformation of the second portion of the piezoelectric layer is decreased, and the piezoelectric deformation of the first portion of the piezoelectric layer is hardly inhibited. As described above, the electric field can be applied to only the first portion during the driving. On the other hand, during the polarization, the electric field can be applied to both of the first portion and the second portion. When the first electrode and the second electrode are not in conduction, it is necessary to provide, for example, terminals and wiring lines in order to apply the voltage to the respective electrodes during the driving and during the polarization. However, owing to the fact that the first electrode and the second electrode are in conduction, it is possible to commonly use a number of terminals and a number of wiring lines.

DESCRIPTION OF THE PREFERRED EMBODIMENTS

An embodiment of the present teaching will be explained below. This embodiment resides in an exemplary case in which the present teaching is applied to an ink-jet printer provided with an ink-jet head for jetting inks to the recording paper.

Figure 1:
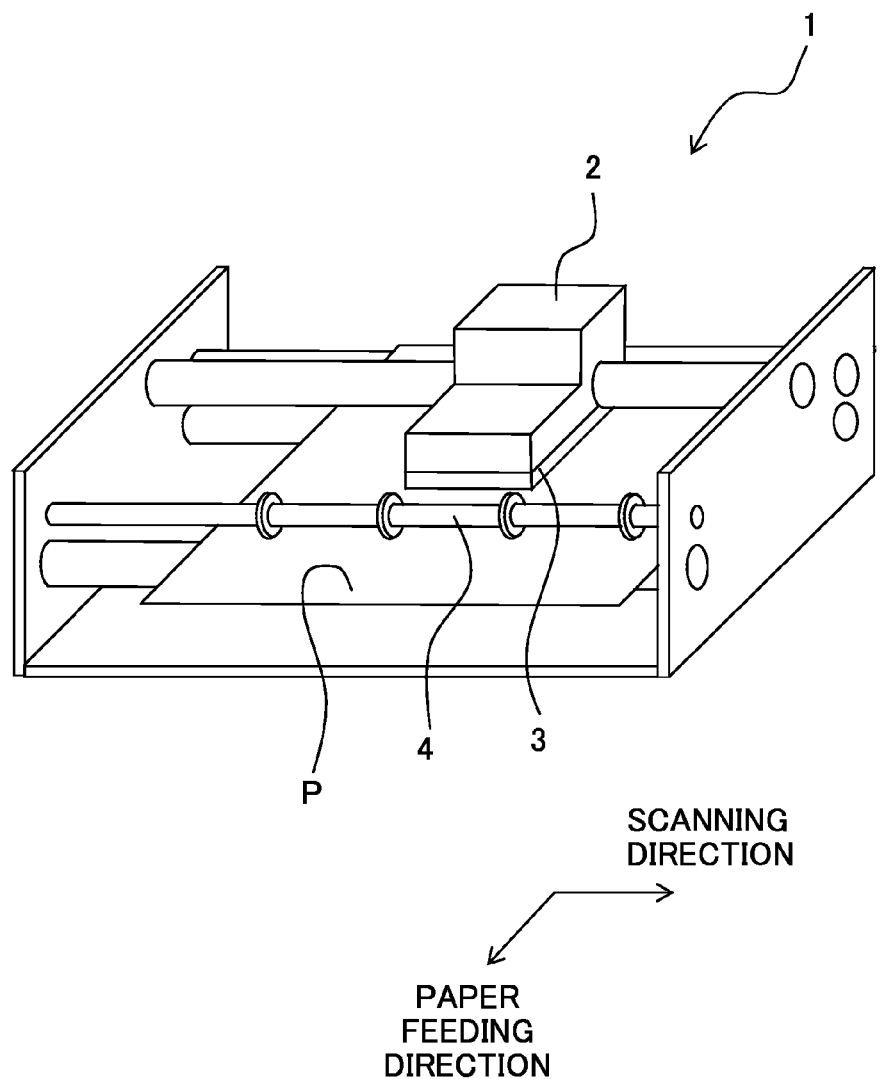
FIG. 1 shows a schematic arrangement illustrating an ink-jet printer according to an embodiment of the present invention.

At first, an explanation will be made with reference to FIG. 1 about a schematic arrangement of the ink jet printer of this embodiment. As shown in FIG. 1, the ink jet printer 1 has, for example, a carriage 2, an ink jet head 3 (liquid transport apparatus), and a transport roller 4.

The carriage 2 is reciprocatively movable in the scanning direction (left-right direction as viewed in FIG. 1). The ink jet head 3 is carried on the carriage 2 Inks are jetted from nozzles 15 (see FIGS. 3 and 4) formed on the lower surface of the ink jet head 3. The transport roller 4 transports the recording paper P in the paper feeding direction (frontward direction as viewed in FIG. 1). In the ink jet printer 1, for example, images and letters are recorded on the recording paper P such that the inks are jetted onto the recording paper P which is transported by the transport roller 4 from the ink-jet head 3 which is reciprocatively movable in the scanning direction together with the carriage 2.

Next, the ink jet head 3 will be explained with reference to FIGS. 2 to 5B. Incidentally, in order to understand the drawings more comprehensively in FIGS. 2 and 3, a flexible printed circuit board (FPC) 48, which is arranged to cover the upper surface of the ink jet head 3, is depicted by alternate long and two short dashes lines. In FIGS. 5A and 5B, FPC 48 and remaining plates except for a plate formed with pressure chambers 10 disposed at the uppermost position of a channel unit 6 are omitted from the illustration. As shown in FIGS. 2 to 5B, the ink jet head 3 has the channel unit 6 (base member) which is formed with the nozzles 15 and ink channels including the pressure chambers 10, and a piezoelectric actuator 7 which applies the pressure to the ink contained in the pressure chambers 10. FPC 48 is joined to the upper surface of the piezoelectric actuator 7.

Figure 4:
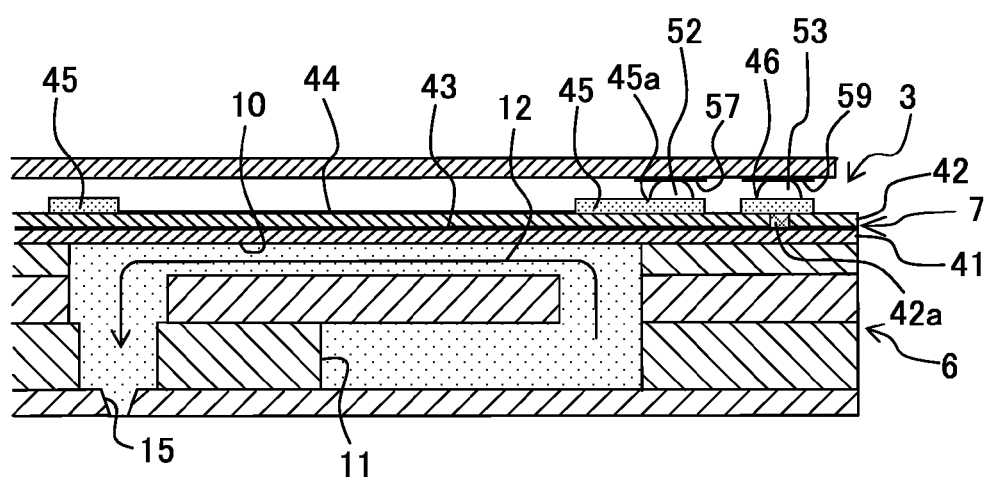
FIG. 4 shows a sectional view taken along a line IV-IV shown in FIG. 3.
Figure 5A:
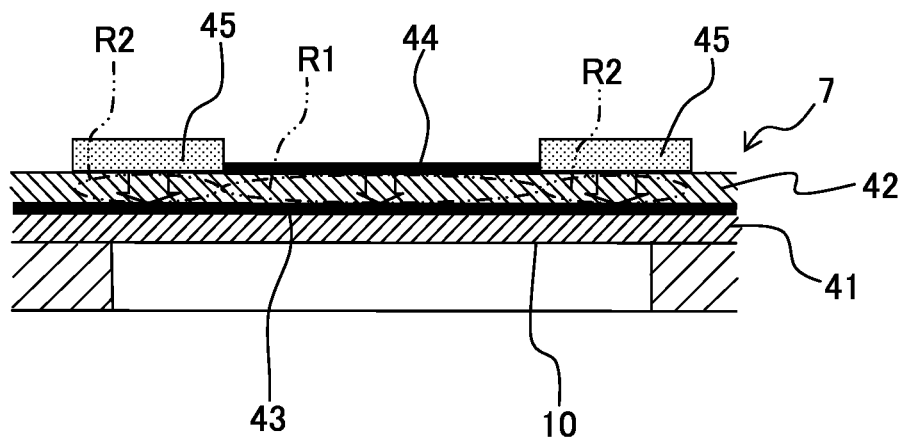
FIGS. 5A and 5B show sectional views taken along a line V-V shown in FIG. 3.
Figure 5B:
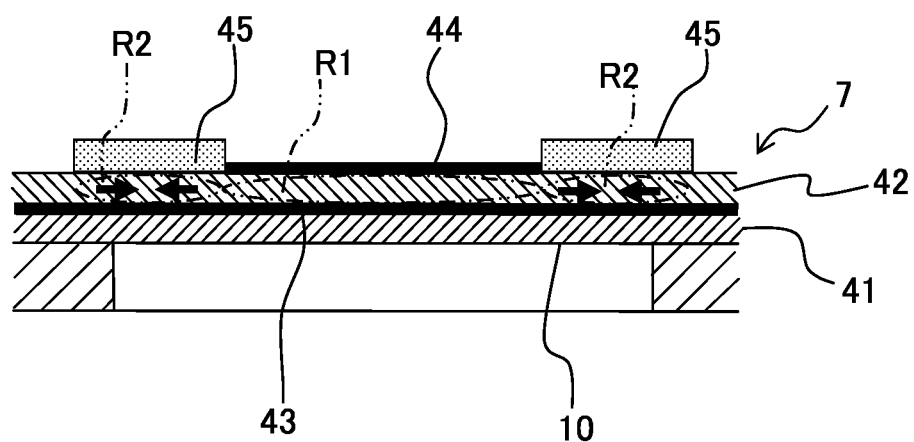

As shown in FIG. 4, the channel unit 6 is formed by mutually stacking a plurality of plates (four plates in this case). The plates, which are included in the plates described above and from which the plate disposed at the lowermost layer formed with the nozzles 15 is excluded, are formed of, for example, a material including, for example, stainless steel such as SUS430 or SUS316 having the conductivity in which the coefficient of linear expansion is larger than that of a piezoelectric material for constructing the piezoelectric layers 41, 42 as described later on. The plate, for which the nozzles 15 are formed, is formed of a synthetic resin material such as polyimide. Alternatively, it is also allowable that the plate, for which the nozzles 15 are formed, is also composed of the same material as that of the other plates. The coefficients of linear expansion SUS430 and SUS316 are about 10.4 $[10^{-6}/°C.]$ and 16.0 $[10^{-6}/°C.]$ respectively.

A manifold 11, which is connected to an ink supply port 9, is communicated with the pressure chambers 10 in the channel unit 6. Further, the pressure chambers 10 are communicated with the nozzles 15. In other words, a plurality of individual ink channels 12, which range from the manifold 11 via the pressure chambers 10 to arrive at the nozzles 15, are formed in the channel unit 6.

Next, the piezoelectric actuator 7 will be explained. The piezoelectric actuator 7 has the two sheets of piezoelectric layers 41, 42 which are stacked on the upper surface of the channel unit 6 to cover the plurality of pressure chambers 10 therewith, the plurality of individual electrodes 44 (first electrodes) and the plurality of outer circumferential electrodes 45 (second electrodes) which are arranged on the upper surface of the piezoelectric layer 41 disposed on the upper side, and a common electrode 43 which is arranged between the two sheets of piezoelectric layers 41, 42.

Each of the two sheets of piezoelectric layers 41, 42 is formed of a piezoelectric material containing a main component of lead titanate zirconate (PZT) which is a ferroelectric substance and which is a solid solution of lead titanate and lead zirconate, and each of the piezoelectric layers 41, 42 has an identical shape (rectangular shape) as viewed in a plan view. The two sheets of stacked piezoelectric layers 41, 42 are joined to the upper surface of the channel unit 6 in a state in which the plurality of pressure chambers 10 are covered with the two sheets of stacked piezoelectric layers 41, 42. The portion of the piezoelectric layer 42 (hereinafter referred to as "active portion R1" as well), which is interposed by the two types of electrodes 44, 43, is polarized downwardly in the thickness direction by applying a predetermined polarization voltage to a portion of the piezoelectric layer 42 disposed on the upper side between the individual electrode 44 and the common electrode 43. Further, the portion of the piezoelectric layer 42 (hereinafter referred to as "stress relaxation portion R2" as well), which is interposed by the two types of electrodes 45, 43, is also polarized downwardly in the thickness direction by applying a predetermined polarization voltage to a portion of the piezoelectric layer 42 disposed on the upper side between the outer circumferential electrode 45 and the common electrode 43.

The piezoelectric layer 41 is joined to the upper surface of the plate disposed at the uppermost layer of the channel unit 6 by means of, for example, a thermosetting adhesive so that the plurality of pressure chambers 10 are covered with the piezoelectric layer 41. The coefficient of linear expansion of the piezoelectric material for constructing the piezoelectric layers 41, 42 is about 5.5 [$10^{-6}/°$ C.]. As described above, the piezoelectric layer 41 is joined to the channel unit 6 (plate formed with the pressure chambers 10) which is formed of the material having the coefficient of linear expansion larger than that of the piezoelectric layer 41. The piezoelectric layer 41 is operated as the vibration plate for causing the unimorph deformation of the piezoelectric layers 41, 42 when the piezoelectric actuator 7 is driven as described later on.

Figure 2:
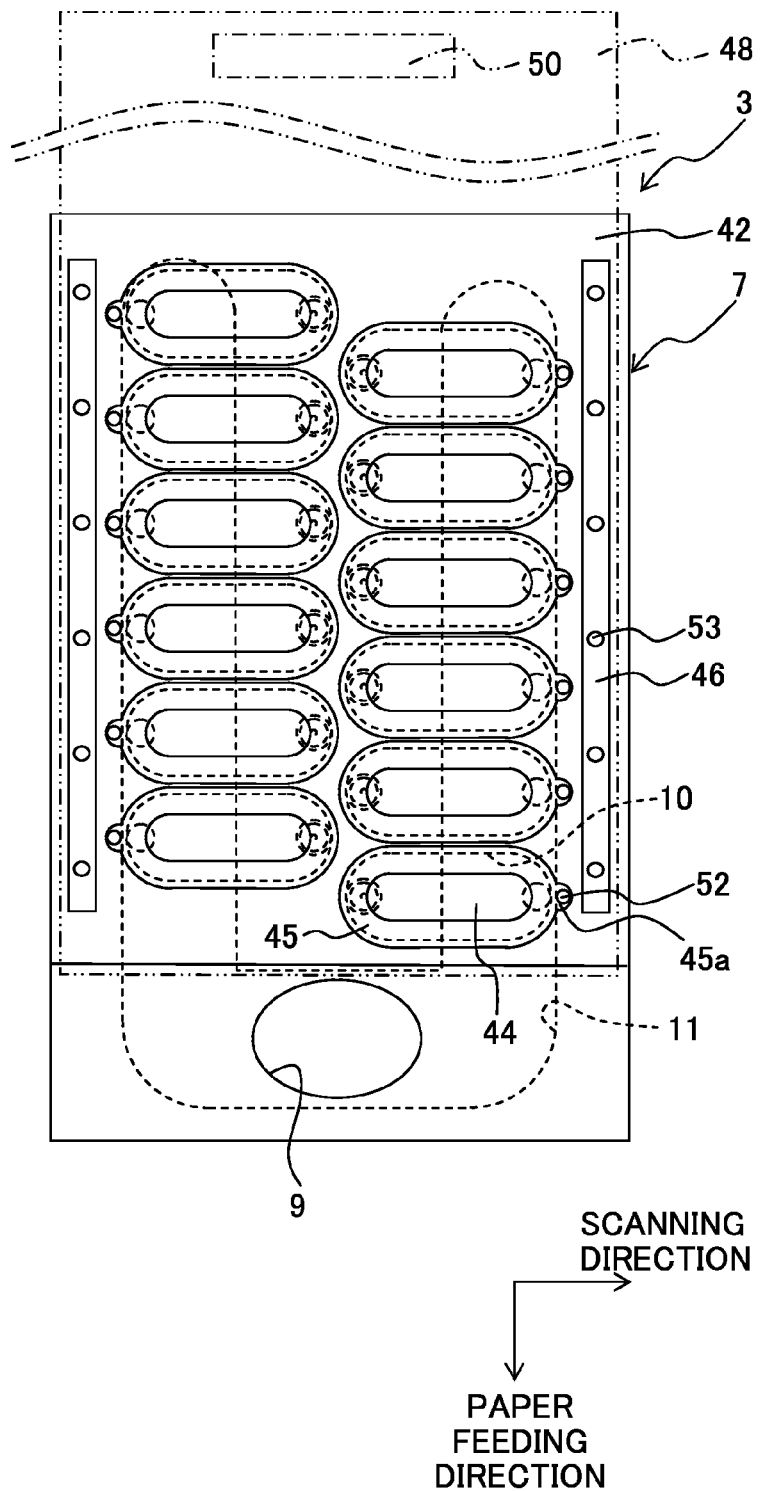
FIG. 2 shows a plan view illustrating an ink-jet head.
Figure 3:
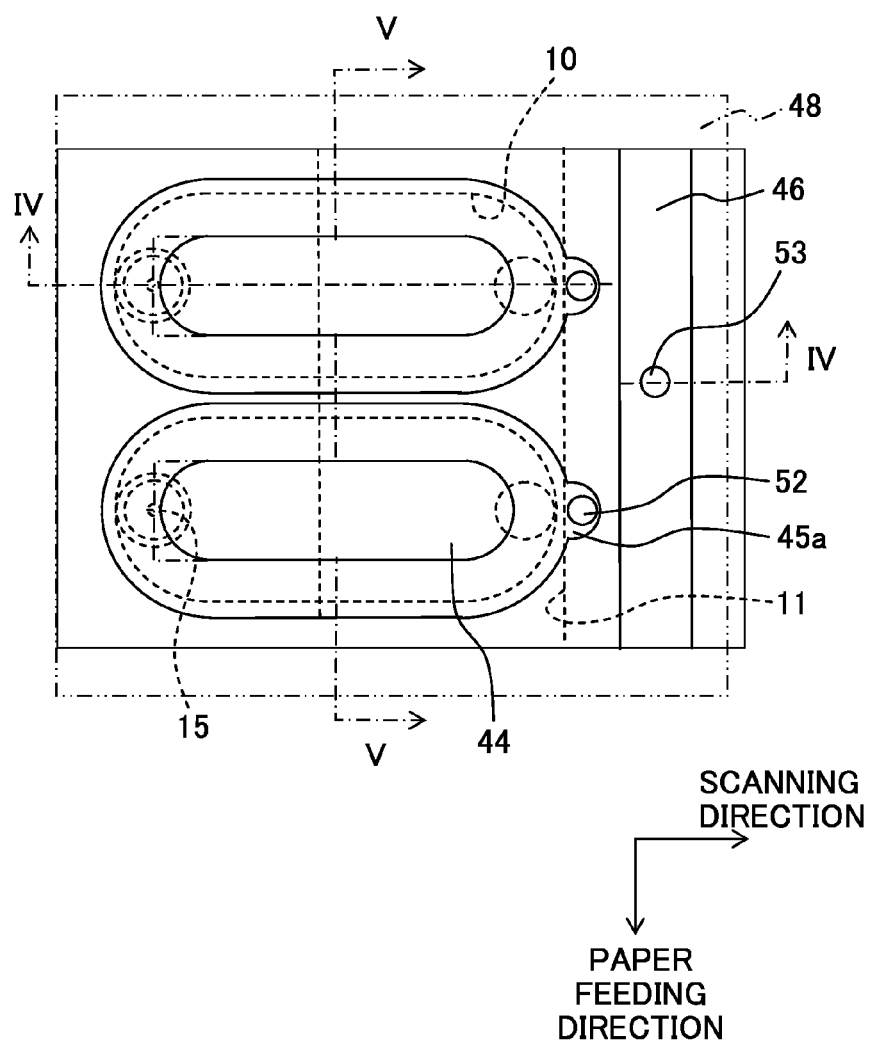
FIG. 3 shows a partial enlarged view illustrating those shown in FIG. 2.
Figure 6A:
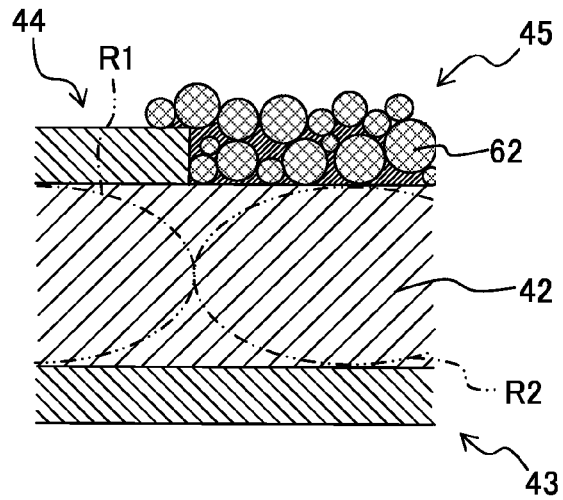
FIG. 6A illustrates the piezoelectric deformation of a portion of a piezoelectric layer facing an outer circumferential electrode, FIG. 6B demonstratively shows a low dielectric layer 47.

The plurality of individual electrodes 44 are formed by using a conductive paste material which contains metal particles (average diameter is about several 10 to several 100 nm) composed of, for example, Ag—Pd in a glass material (example of a binder) (see FIG. 6A). The plurality of individual electrodes 44 are arranged on the upper surface of the piezoelectric layer 42 so that the plurality of individual electrodes 44 correspond to the plurality of pressure chambers 10. As shown in FIGS. 2 and 3, the individual electrode 44 has a substantially elliptical shape which is one size smaller than the pressure chamber 10 as viewed in a plan view. The individual electrode 44 faces a substantially central portion of the pressure chamber 10.

A paste material for forming the plurality of outer circumferential electrodes 45 is provided such that metal particles (average diameter is several microns), which have diameters larger than those in the case of the individual electrodes 44, are blended in a glass material, although the blending ratio between the glass material and the metal particles is approximately identical as compared with the paste material for forming the individual electrodes 44. The outer circumferential electrodes 45 are arranged on the upper surface of the piezoelectric layer 42 while surrounding the plurality of individual electrodes 44. The outer circumferential electrodes 45 are brought in contact with the entire circumferences of the plurality of individual electrodes 44 to cause the conduction. The outer circumferential electrode 45 has a substantially elliptical shape which is slightly larger than the pressure chamber 10 as viewed in a plan view. The outer circumferential electrode 45 is formed to be thicker than the individual electrode 44. A plurality of connecting terminals 45a are led respectively from end portions of the plurality of outer circumferential electrodes 45 in the longitudinal direction of the elliptical individual electrodes 44.

The common electrode 43 is formed of a conductive paste material which is the same as or equivalent to that of the individual electrode 44, and the common electrode 43 is formed over the substantially entire region between the piezoelectric layer 41 and the piezoelectric layer 42. The common electrode 43 is arranged on the other surface of the piezoelectric layer 42 so that the common electrode 43 faces the plurality of individual electrodes 44 and the plurality of outer circumferential electrodes 45 arranged on one surface of the piezoelectric layer 42.

As shown in FIG. 4, bumps 52, which are formed of a conductive adhesive, are arranged respectively on the plurality of connecting terminals 45a. The respective connecting terminals 45a are connected via the bumps 52 to first connecting electrode portions 57 of FPC 48 arranged to cover the upper surface of the piezoelectric actuator 7 therewith. The conductive adhesive is an adhesive which contains a large number of metal particles (for example, silver (Ag) particles) in a thermosetting resin such as epoxy resin or the like. The conductivity is expressed while the conductive adhesive is cured by being pressurized and heated, wherein two objectives to be connected are mechanically joined and the both are allowed to be in the electrical conduction. The driving signal having a driving frequency of several kHz, in which the driving electric potential (for example, about 20 V) and the ground electric potential are combined, is applied to the plurality of individual electrodes 44 respectively from driver IC 50 (see FIG. 2) mounted on FPC 48 via the plurality of outer circumferential electrodes 45.

As shown in FIG. 2, two surface electrodes 46, which extend in the paper feeding direction along the edges, are formed respectively at both end portions (edge portions) in the scanning direction of the upper surface of the piezoelectric layer 42 (upper surface of the piezoelectric actuator 7). As shown in FIG. 4, through-holes 42a are formed in the areas of the piezoelectric layer 42 in which the surface electrodes 46 are formed. A conductive material is charged into the through-holes 42a. The surface electrodes 46 are in conduction with the common electrode 43 arranged between the two piezoelectric layers 41, 42 by means of the conductive material with which the through-holes 42a are filled. Further, a plurality of bumps 53, which are formed of the same or equivalent conductive adhesive as that of the bumps 52, are arranged on the surface electrodes 46 so that appropriate spacing distances are provided in the longitudinal direction of the surface electrodes 46. The surface electrodes 46 are connected via the bumps 53 to second connecting electrode portions 59 of FPC 48. Further, the common electrode 43 is connected to the driver IC 50 mounted on FPC 48, and the common electrode 43 is always retained at the ground electric potential.

FPC 48 is joined to the piezoelectric actuator 7 in a state in which a part thereof is arranged to face the upper surface of the piezoelectric actuator 7. Further, FPC 48 is led horizontally from one portion (upward portion as viewed in FIG. 2) of the piezoelectric actuator 7 in the array direction of the nozzles 15, and FPC 48 is led upwardly while being bent.

As shown in FIG. 5A, a high polarization voltage is applied for a long period of time at the production stage to the active portion R1 which is interposed between the common electrode 43 and the individual electrode 44 of the piezoelectric layer 42 in the piezoelectric actuator 7. Accordingly, the active portion R1 is polarized downwardly in the thickness direction. Further, a high polarization voltage, which is identical with the polarization voltage for the active portion R1, is also applied for a long period of time at the production stage to the stress relaxation portion R2 which is interposed between the common electrode 43 and the outer circumferential electrode of the piezoelectric layer 42. Accordingly, the stress relaxation portion R2 is also polarized in the thickness direction. The stress relaxation portion R2 is shrunk in the in-plane direction perpendicular to the thickness direction by being polarized in the thickness direction, and the stress relaxation portion R2 retains the shrunk state.

When the piezoelectric layers 41, 42, which are made of the piezoelectric material, are joined with the plate which is made of the metal material and which is formed with the pressure chambers 10 of the channel unit 6 by means of the thermosetting adhesive, it is necessary that they should be heated when they are joined with each other. When the temperature is returned to the ordinary temperature (room temperature) after the heating, any compressive stress remains in the in-plane direction in the piezoelectric layer 41 and the piezoelectric layer 42 including the active portion R1, on account of the difference in the coefficient of linear expansion between the piezoelectric material and the metal material.

In view of the above, in the embodiment of the present teaching, the stress relaxation portion R2, which is arranged to surround the individual electrode 44 (active portion R1) as viewed in a plan view, is shrunk in the in-plane direction. As a result of the shrinkage, the active portion R1 of the piezoelectric layers 41, 42 is pulled in parallel to the in-plane direction in a plurality of different directions toward the outside of the active portion R1. Accordingly, the compressive stress, which remains in the active portion R1, is relaxed or mitigated.

Next, an explanation will be made about a method for driving the piezoelectric actuator 7. Before the driving of the piezoelectric actuator 7, the common electrode 43 is connected to the driver IC 50, and the common electrode 43 is retained at the ground electric potential. The individual electrode 44 is previously retained at the ground electric potential via the outer circumferential electrode 45 connected to the driver IC 50.

When the piezoelectric actuator 7 is driven, the electric potential of the individual electrode 44 is switched to a predetermined driving electric potential (for example, about 20 V). Accordingly, the electric potential difference is generated between the individual electrode 44 and the common electrode 43, and the electric field in the thickness direction is generated in the active portion R1 in accordance with the electric potential difference. The direction of the electric field is coincident with the direction of polarization of the active portion R1. Therefore, the active portion R1 is shrunk in the in-plane direction perpendicular to the direction of polarization, and the portions of the piezoelectric layer 41 and the piezoelectric layer 42, which faces the pressure chamber 10, are deformed as a whole so that the portions protrude toward the pressure chamber 10 (so-called unimorph deformation). Accordingly, the volume of the pressure chamber 10 is decreased, and the pressure of the ink contained in the pressure chamber 10 is raised (pressure is applied to the ink contained in the pressure chamber 10). The ink is jetted from the nozzle 15 communicated with the pressure chamber 10.

Figure 6B:
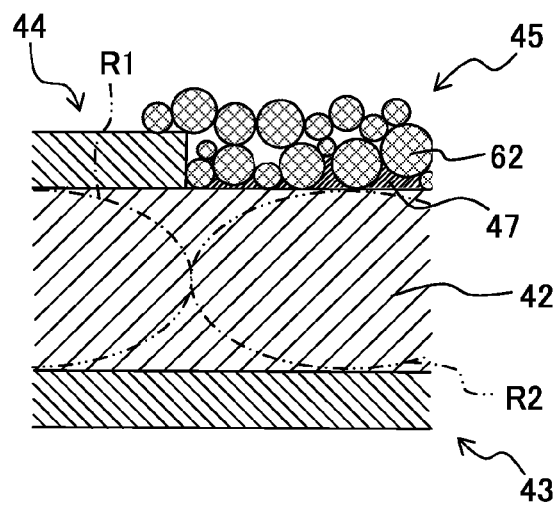
FIG. 6C shows an equivalent circuit diagram of those shown in FIG. 6A.

In this arrangement, as described above, the outer circumferential electrode 45 is formed of the conductive paste material which contains the metal particles having the diameters larger than those of the individual electrode 44 (common electrode 43). The hatched portion shown in FIG. 6A indicates the binder such as the glass material or the like contained in the conductive paste material. The hatched portion shown in FIG. 6B indicates a part of the hatched portion shown in FIG. 6A corresponding to a low dielectric layer 47 described later on. In this embodiment, the second electrode of the present teaching corresponds to the metal particles 62 of the outer circumferential electrode 45, and the low dielectric layer of the present teaching corresponds to the low dielectric layer 47 indicated by the hatching shown in FIG. 6B. As shown in FIGS. 6A and 6B, the areal size, with which one metal particle 62 is brought in contact with the piezoelectric layer 42, is approximately identical irrelevant to the diameter. Therefore, the larger the number of metal particles 62 brought in contact with the piezoelectric layer 42 is, the larger the areal size of the conducting portions exposed to the surface to make contact with the piezoelectric layer 42 is. That is, the outer circumferential electrode 45 is formed of the conductive paste material which contains the metal particles 62 having the average particle size (diameter) larger than that of the individual electrode 44 (common electrode 43), and thus the number of metal particles 62 brought in contact with the piezoelectric layer 42 is decreased. The insulating material and the air are brought in contact with one surface of the piezoelectric layer 42 in large amounts, and the contact areal size of the metal particles 62 is decreased as compared with such a case that the electrode is formed of the conductive paste material which contains the metal particles having the small average particle size (diameter) as in the case of the individual electrode 44 (common electrode 43). Further, the low dielectric layer 47 (see FIG. 6B), which is composed of the insulating material and the air, exists at the portion of the outer circumferential electrode 45 to make contact with the piezoelectric layer 42. It is appropriate in the present teaching that the dielectric constant (specific inductive capacity) of the low dielectric layer 47 is lower than the dielectric constant (specific inductive capacity) of the piezoelectric layer 42.

Figure 6C:
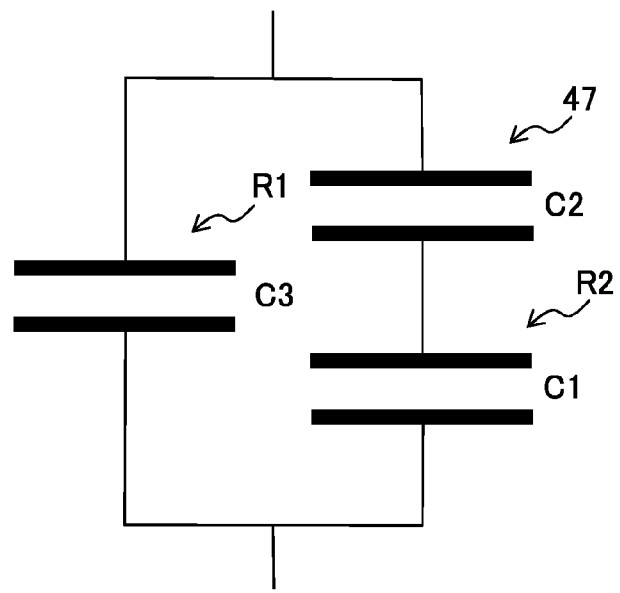

FIG. 6C shows the equivalent circuit diagram for the portion of the piezoelectric layer 42 interposed between the individual electrode 44 and the common electrode 43 and the portion of the piezoelectric layer 42 interposed between the outer circumferential electrode 45 and the common electrode 43. According to this equivalent circuit diagram, the portion interposed between the outer circumferential electrode 45 and the common electrode 43 corresponds to the circuit in which a capacitor C1 composed of the stress relaxation portion R2 of the piezoelectric layer 42 and a capacitor C2 composed of the low dielectric layer 47 described above are connected in series. The portion interposed between the individual electrode 44 and the common electrode 43 corresponds to the circuit in which only a capacitor C3 composed of the active portion R1 of the piezoelectric layer 42 is provided.

In the embodiment of the present teaching, the thickness of the piezoelectric layer is about 20 μm, and the thickness of the low dielectric layer 47 is about 1 μm. The dielectric constant of the piezoelectric layer 42 is about 2000, and the dielectric constant of the low dielectric layer 47 is about 1 to 10. Therefore, the combined capacitance of the capacitor C1 and the capacitor C2 is extremely smaller than the capacitance of the capacitor C3. Therefore, the voltage is concentrated on the capacitor C2 in the case of the driving signal having a driving frequency of several kHz. Therefore, the voltage is scarcely applied to the capacitor C1, and a minute electric field is merely applied for a short period of time to the stress relaxation portion R2 of the piezoelectric layer 42. According to the fact as described above, when the driving signal is inputted in order to drive the piezoelectric actuator 7, then the active portion R1 of the piezoelectric layer 42 is piezoelectrically deformed, but the stress relaxation portion R2 is hardly piezoelectrically deformed.

On the other hand, when the stress relaxation portion R2 of the piezoelectric layer 42 is polarized, the DC high polarization voltage is applied for a long period of time as described above without applying any AC voltage having a frequency in an order of kHz such as the driving frequency. Accordingly, the low dielectric layer 47 (capacitor C2) cannot retain the insulated state, and the electric charge leaks to cause the electric discharge. Therefore, the polarization voltage is applied to the stress relaxation portion R2 (capacitor C1) of the piezoelectric layer 42. Thus, the stress relaxation portion R2 of the piezoelectric layer 42 can be polarized. As for the portion of the individual electrode 44 brought in contact with the piezoelectric layer 42, it is also considered that the layer (hereinafter this layer is referred to as "second low dielectric layer"), which is composed of the insulating material and the air and which has the dielectric constant lower than that of the piezoelectric layer 42, is present. However, the thickness of the second low dielectric layer described above is thinner than that of the low dielectric layer 47. Therefore, the second low dielectric layer has the large capacitance as compared with the low dielectric layer 47. Therefore, when the driving signal having a high frequency is allowed to flow, the voltage, which is applied to the second low dielectric layer, is lower than the voltage which is applied to the low dielectric layer 47. Therefore, the voltage, which is applied to the portion (hereinafter referred to as "first piezoelectric portion") of the piezoelectric layer 42 positioned under the individual electrode 44, is sufficiently larger than the voltage which is applied to the portion of the piezoelectric layer 42 positioned under the outer circumferential electrode 45. Therefore, when the driving signal is allowed to flow, the electric field is applied to the first piezoelectric portion in order to cause the piezoelectric deformation sufficient to jet a desired amount of the ink. In this way, even when the second low dielectric layer exists between the individual electrode 44 and the piezoelectric layer 42, the sufficient electric field is applied to the first piezoelectric portion.

According to this embodiment, the outer circumferential electrode 45 is arranged to surround the individual electrode 44 on the surface of the piezoelectric layer 42 disposed on the side opposite to the surface on which the common electrode 43 is arranged. The outer circumferential electrode 45 is in conduction with the individual electrode 44. When the portion of the piezoelectric layer 42, which is interposed between the outer circumferential electrode 45 and the common electrode 43, is polarized in the thickness direction, the portion of the piezoelectric layer 42, which is interposed between the outer circumferential electrode 45 and the common electrode 43, is retained while being shrunk in the in-plane direction of the piezoelectric layer 42. Accordingly, the active portion R1 of the piezoelectric layer 42, which is interposed between the individual electrode 44 and the common electrode 43, is pulled in the in-plane direction. Therefore, the compressive stress acting on the active portion R1 of the piezoelectric layer 42, which is generated when the piezoelectric layers 41, 42 are joined as described above, can be relaxed. Accordingly, the decrease in the deformation amount of the active portion R1 can be suppressed, and the decrease in the jetting amount of the ink can be suppressed.

The individual electrode 44 and the outer circumferential electrode 45 are in conduction. Therefore, when the driving voltage is applied to the individual electrode 44 in order to piezoelectrically deform the active portion R1 of the piezoelectric layer 42, the driving voltage is also applied to the outer circumferential electrode 45. However, the low dielectric layer 47 is formed between the outer circumferential electrode 45 and the piezoelectric layer 42, and the voltage is concentrated on the low dielectric layer 47 when the driving voltage is applied. Therefore, the voltage is scarcely applied to the stress relaxation portion R2 of the piezoelectric layer 42. As a result, the piezoelectric deformation of the stress relaxation portion R2 of the piezoelectric layer 42 is decreased, and the piezoelectric deformation of the active portion R1 of the piezoelectric layer 42 is hardly inhibited. As described above, during the driving, it is possible to substantially apply the electric field to only the active portion R1. On the other hand, during the polarization, it is possible to apply the electric field to both of the active portion R1 and the stress relaxation portion R2.

Further, if the individual electrode 44 and the outer circumferential electrode 45 are not in conduction, it is necessary to provide any arrangement including, for example, terminals and wiring lines for applying the voltage to the respective electrodes. In this case, for example, the number of terminals and the number of wiring lines are twice the number of terminals and the number of wiring lines required when the outer circumferential electrode 45 does not exist. However, owing to the fact that the individual electrode 44 and the outer circumferential electrode 45 are in conduction, it is possible to commonly use the terminals and the wiring lines, and it is possible to suppress the number of terminals and the number of wiring lines.

The stress relaxation portion R2 of the piezoelectric layer 42 is arranged to surround the active portion R1. The active portion R1 of the piezoelectric layer 42 is pulled in a plurality of different directions parallel to the in-plane direction of the piezoelectric layer 42. Therefore, the compressive stress of the active portion R1 of the piezoelectric layer 42 can be relaxed more efficiently. Further, when any crack appears in the in-plane direction of the piezoelectric layer 42, it is possible to suppress the crack from arriving at the active portion R1 of the piezoelectric layer 42 and suppress the fluctuation of the piezoelectric characteristic. Further, the degree of freedom of the arrangement of the connecting terminal 45a is raised.

Further, the stress relaxation portion R2 of the piezoelectric layer 42 is arranged to surround the active portion R1 in the area facing the pressure chamber 10, and hence the stress relaxation portion R2 of the piezoelectric layer 42 is disposed near to the active portion R1 of the piezoelectric layer 42. It is possible to greatly relax the compressive stress in the active portion R1 of the piezoelectric layer 42.

The bump 52 for applying the voltage to the individual electrode 44 and the bump 53 for applying the voltage to the common electrode 43 are formed on the outer circumferential electrode 45 and the surface electrode 46 which are formed of the same material. Therefore, when the outer circumferential electrode 45 and the surface electrode 46 are formed in an identical step, then it is possible to uniformize the height of the outer circumferential electrode 45 and the height of the surface electrode 46, and it is possible to suppress the connection failure of FPC 48.

The conductive material for forming the outer circumferential electrode 45 has the diameters of the contained metal particles which are different from those of the conductive material for forming the individual electrode 44, but the blending ratio between the binder (for example, the glass material) and the metal particles is substantially identical. Therefore, it is possible to maintain the small resistance value while forming the low dielectric layer 47.

Figure 7A:
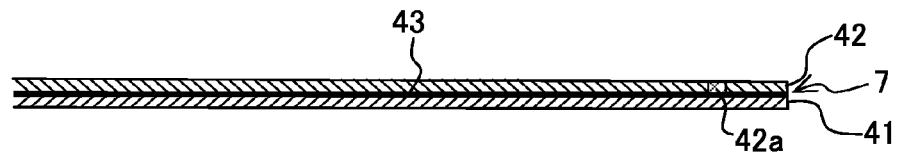
FIGS. 7A to 7F show steps of producing a piezoelectric actuator until the piezoelectric actuator is connected to FPC.
Figure 7B:
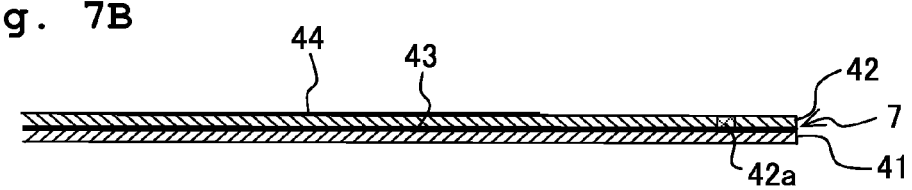
Figure 7C:
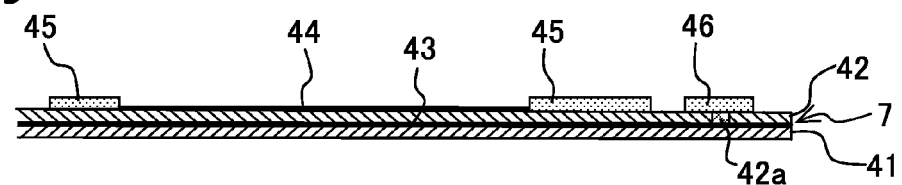

Next, an explanation will be made with reference to FIGS. 7A to 7F about steps of producing the piezoelectric actuator 7 until the piezoelectric actuator 7 is connected to FPC 48. At first, the channel unit 6 is joined to the piezoelectric layer 41 while performing the heating by using the thermosetting adhesive as described above (joining step). As shown in FIG. 7A, the common electrode 43 is formed on one surface of the piezoelectric layer 41, the piezoelectric layer 42 is stacked on the surface of the common electrode 43 disposed on the side opposite to the piezoelectric layer 41, and the through-holes 42a are formed through the piezoelectric layer 42. The conductive material is charged into the through-holes 42a. As shown in FIG. 7B, the individual electrodes 44 are formed on the surface of the piezoelectric layer 41 (first electrode forming step). After that, as shown in FIG. 7C, the outer circumferential electrodes 45 and the surface electrodes 46 are formed on the surface of the piezoelectric layer 41 (second electrode forming step: surface electrode forming step). It is also appropriate that the outer circumferential electrode 45 is formed to override the individual electrode 44 in order to allow the outer circumferential electrode 45 to be in conduction with the individual electrode 44 reliably. Any order is available in relation to the first electrode forming step and the second electrode forming step (surface electrode forming step).

Figure 7D:
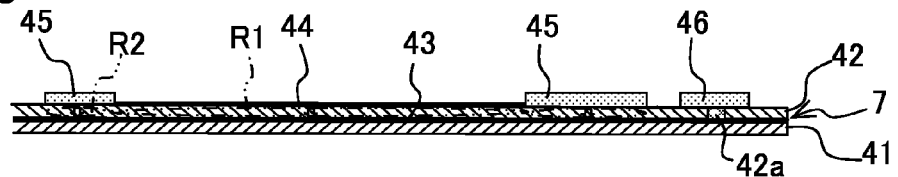
Figure 7E:
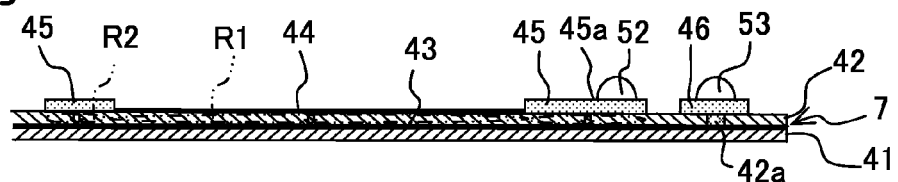
Figure 7F:
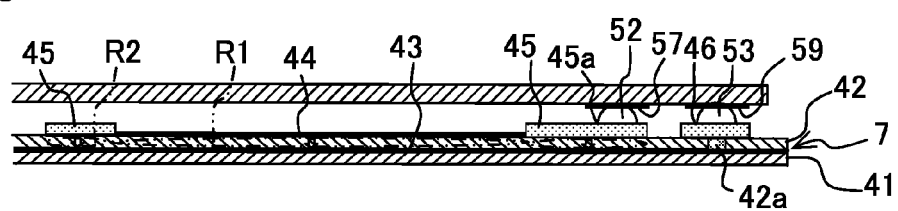

After that, as shown in FIG. 7D, the polarization voltage is applied between the individual electrode 44 (outer circumferential electrode 45) and the common electrode 43 to polarize the portion of the piezoelectric layer 41 interposed between the individual electrode 44 and the common electrode 43 and the portion interposed between the outer circumferential electrode 45 and the common electrode 43 (polarizing step). As shown in FIG. 7E, the bumps 52 are formed on the outer circumferential electrodes 45, and the bumps 53 are formed on the surface electrodes 46 (bump forming step). As shown in FIG. 7F, FPC 48 is arranged so that the upper surface of the piezoelectric layer 42 is covered therewith. The first connecting electrode portions 57 are joined to the bumps 52, and the second connecting electrode portions 59 are joined to the bumps 53.

According to this method for producing the piezoelectric actuator 7, the polarization voltage can be applied to the outer circumferential electrodes 45 in the polarizing step, and the portions of the piezoelectric layer 42, which face the outer circumferential electrodes 45, can be shrunk in the in-plane direction. Accordingly, it is possible to relax the compressive stress in the in-plane direction allowed to remain in the piezoelectric layer 42 in the joining step (compressive stress generated at the portions of the piezoelectric layer 42 facing the individual electrodes 44).

Further, the polarization voltage is applied between the individual electrode 44 or the outer circumferential electrode 45 and the common electrode 43 after the individual electrode 44 and the outer circumferential electrode 45 in conduction with the individual electrode 44 are formed. Therefore, it is possible to polarize the portion (active portion R1) of the piezoelectric layer facing the individual electrode 44 and the portion (stress relaxation portion R2) of the piezoelectric layer facing the outer circumferential electrode 45 at once. It is possible to simplify the production steps. The outer circumferential electrode 45 and the surface electrode 46 can be formed in the identical step. Therefore, it is possible to uniformize the height of the outer circumferential electrode 45 and the height of the surface electrode 46. It is possible to suppress the connection failure of FPC 48.

Next, an explanation will be made about modified embodiments in which various modifications are applied to the embodiment of the present teaching. However, those constructed in the same manner as those of the embodiment of the present teaching are designated by the same reference numerals, any explanation of which will be appropriately omitted.

In the embodiment of the present teaching, the outer circumferential electrode 45 is arranged while making contact with the entire circumference of the individual electrode 44 in the area of the piezoelectric layer 42 facing the pressure chamber 10. However, it is enough that the outer circumferential electrode 45 is arranged at any position on the piezoelectric layer 42 different from the position of the individual electrode 44. This feature will be described below as exemplified by an example.

Figure 8A:
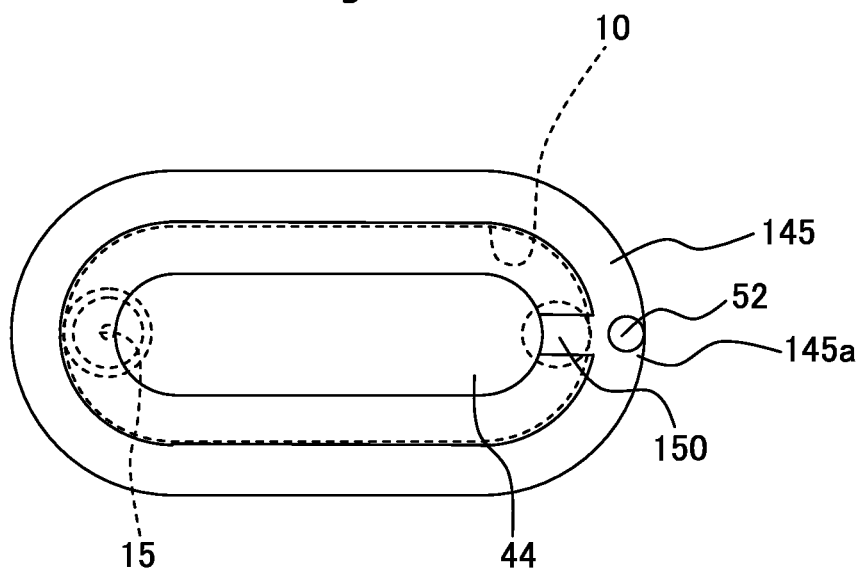
FIGS. 8A and 8B show partial enlarged plan views illustrating ink jet heads in modified embodiments respectively.

As shown in FIG. 8A, an outer circumferential electrode 145 may be arranged in an area of the piezoelectric layer 42 to surround the area facing the pressure chamber 10, and the outer circumferential electrode 145 may be in conduction by being connected to the individual electrode 44 via a connecting portion 150. In this arrangement, the connecting portion 150 is formed of the same material as that of the outer circumferential electrode 145. A connecting terminal 145a is formed for the outer circumferential electrode 145, and the bump 52 is formed on the connecting terminal 145a. When the outer circumferential electrode 145 is arranged in an area facing the pressure chamber 10, a factor arises to inhibit the deformation of the active portion of the piezoelectric layer 42 due to the rigidity of the outer circumferential electrode 145. In view of the above, in this modified embodiment, the stress relaxation portion of the piezoelectric layer 42 is arranged to face the area of the piezoelectric layer 41 joined to the channel unit 6 while surrounding the active portion. Therefore, the piezoelectric deformation of the active portion of the piezoelectric layer 42 is hardly inhibited, while relaxing the compressive stress at the active portion of the piezoelectric layer 42.

Figure 8B:
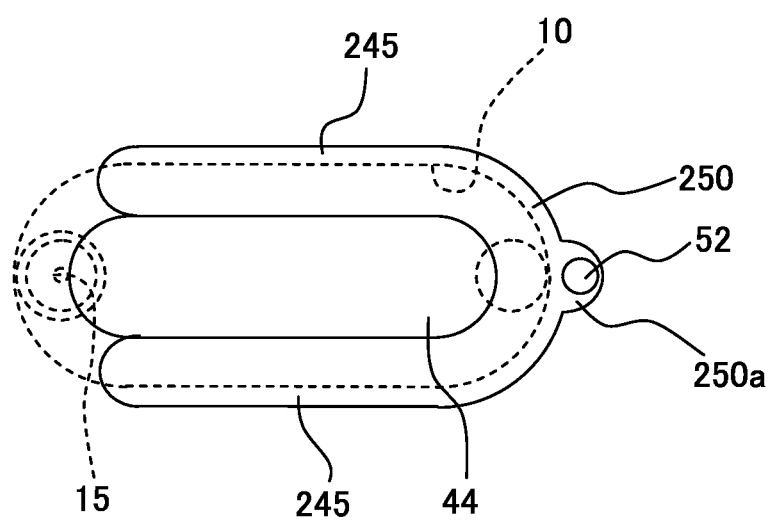

As shown in FIG. 8B, an outer circumferential electrode 245 may be arranged on the both sides in the paper feeding direction without surrounding the entire circumference of the individual electrode 44. The outer circumferential electrode 245, which is arranged on the both sides of the individual electrode 44 in the paper feeding direction, is in conduction by being connected via a connecting portion 250. The connecting portion 250 is formed of the same material as that of the outer circumferential electrode 245. A connecting terminal 250a is formed for the connecting portion 250, and the bump 52 is formed on the connecting terminal 250a. Accordingly, when the stress relaxation portion of the piezoelectric layer 42, which faces the outer circumferential electrode 245, shrinks the piezoelectric layer 42 in the in-plane direction, the active portion R1 of the piezoelectric layer 42 is pulled to the both sides in the paper feeding direction. Therefore, it is possible to efficiently relax the compressive stress of the active portion R1 of the piezoelectric layer 42. The outer circumferential electrode 245 may be arranged on the both sides in the scanning direction of the individual electrode 44.

Figure 9:
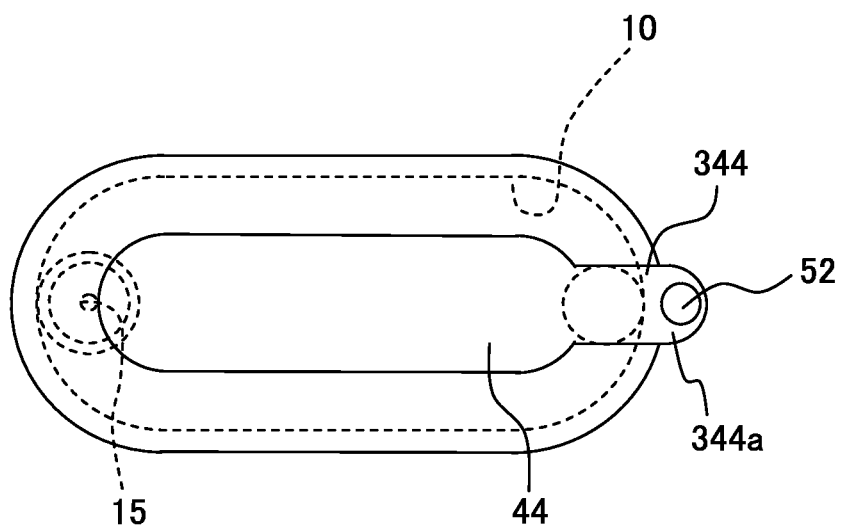
FIG. 9 shows a partial enlarged plan view illustrating an ink jet head in a modified embodiment.

In the embodiment of the present teaching, the bump 52 is formed on the connecting terminal 45a composed of the same material as that of the outer circumferential electrode 45. As shown in FIG. 9, it is also allowable to form a leading electrode 344 which is led from the individual electrode 44 and which extends to an area not facing the pressure chamber 10, wherein a connecting terminal 344a is formed in an area of the leading electrode 344 not facing the pressure chamber 344, and the bump 52 is formed on the connecting terminal 344a. Accordingly, the individual electrode 44 and the outer circumferential electrode 45 are in conduction, although the materials thereof are different from each other. It is temporarily considered that the bump 52 may be formed on the outer circumferential electrode 45, and the voltage may be applied from the bump 52 via the outer circumferential electrode 45 to the individual electrode 44. However, as compared with such an arrangement, when the bump 52 is formed on the leading electrode 344 which is composed of the same material as that of the individual electrode 44 and which is led from the individual electrode 44, the voltage can be reliably applied from the bump 52 to the individual electrode 44. Further, the bump 52 is formed in the area not facing the pressure chamber 10, and thus the deformation is hardly inhibited for the portion of the piezoelectric layer 42 facing the pressure chamber 10. In this arrangement, the height is easily uniformized when the surface electrode 46, on which the bump 53 is formed to apply the voltage to the common electrode 43, is formed in the same step by using the same material as that of the individual electrode 44.

In the embodiment of the present teaching, the active portion R1 of the piezoelectric layer 42 and the stress relaxation portion R2 are simultaneously polarized in the polarizing step performed once. However, when a difference in relation to the degree of polarization is desired, it is possible to perform the process in accordance with the following steps (see FIGS. 10A to 10G).

Figure 10A:
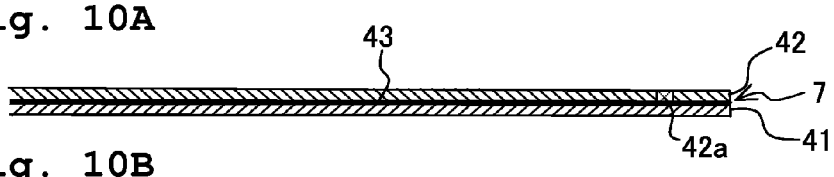
FIGS. 10A to 10G show steps of producing a piezoelectric actuator until the piezoelectric actuator is connected to FPC in a modified embodiment.
Figure 10B:
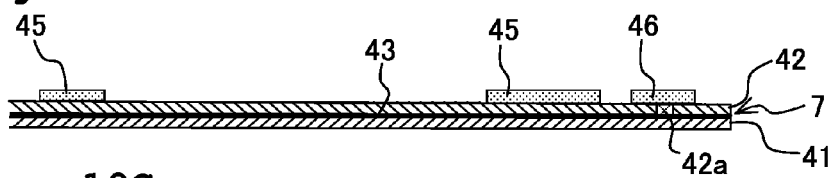
Figure 10C:
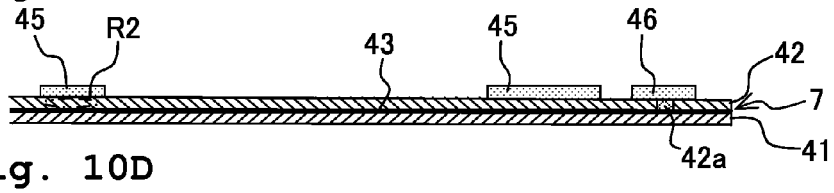

At first, the channel unit 6 is joined to the piezoelectric layer 41 while performing the heating by using the thermosetting adhesive in the same manner as the embodiment described above (joining step). As shown in FIG. 10A, the common electrode 43 is formed on one surface of the piezoelectric layer 41, the piezoelectric layer 42 is stacked on the surface of the common electrode 43 disposed on the side opposite to the piezoelectric layer 41, and the through-holes 42a are formed through the piezoelectric layer 42. The conductive material is charged into the through-holes 42a. As shown in FIG. 10B, the outer circumferential electrodes 45 and the surface electrodes 46 are formed on the surface of the piezoelectric layer 41 (second electrode forming step). After that, as shown in FIG. 10C, the polarization voltage is applied between the outer circumferential electrodes 45 and the common electrode 43 to polarize the portions of the piezoelectric layer 41 interposed between the outer circumferential electrodes 45 and the common electrode 43 (first polarizing step).

Figure 10D:
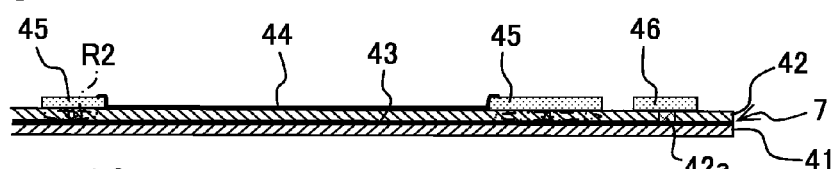
Figure 10E:
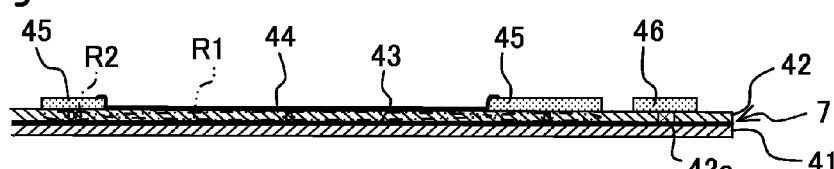
Figure 10F:
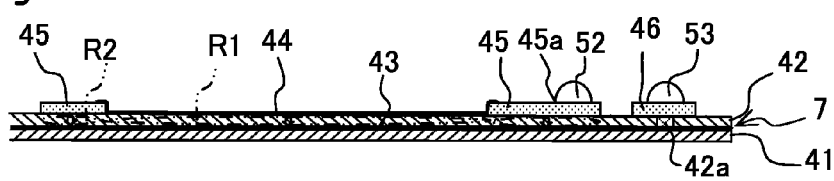
Figure 10G:
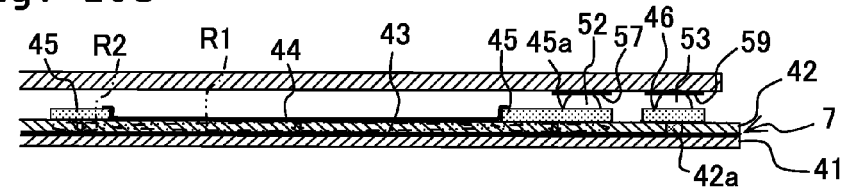

Subsequently, as shown in FIG. 10D, the individual electrodes 44 are formed on the surface of the piezoelectric layer 41 (first electrode forming step). It is preferable that the individual electrode 44 is formed to override the outer circumferential electrode 45 in order to allow the individual electrode 44 to be in conduction with the outer circumferential electrode 45 reliably. As shown in FIG. 10E, the polarization voltage, which is smaller than that provided in the first polarizing step, is applied between the outer circumferential electrodes 45 and the common electrode 43 to polarize the portions of the piezoelectric layer 41 interposed between the individual electrodes 44 and the common electrode 43 and the portions interposed between the outer circumferential electrodes 45 and the common electrode 43 (second polarizing step). As shown in FIG. 10F, the bumps 52 are formed on the outer circumferential electrodes 45, and the bumps 53 are formed on the surface electrodes 46 (bump forming step). As shown in FIG. 10G, FPC 48 is arranged so that the upper surface of the piezoelectric layer 42 is covered therewith. The first connecting electrode portions 57 are joined to the bumps 52, and the second connecting electrode portions 59 are joined to the bumps 53.

According to this method for producing the piezoelectric actuator 7, the polarization voltage is applied to the outer circumferential electrodes 45 in the polarizing step, and the portions of the piezoelectric layer 42, which face the outer circumferential electrodes 45, are shrunk in the in-plane direction. Accordingly, it is possible to relax the compressive stress in the in-plane direction allowed to remain in the piezoelectric layer 42 in the joining step (compressive stress generated at the portions of the piezoelectric layer 42 facing the individual electrodes 44).

Further, the polarization voltage for the stress relaxation portion R2 of the piezoelectric layer 42 can be made higher than the polarization voltage for the active portion R1 of the piezoelectric layer 42. Therefore, the polarization can be effected with the large polarization voltage to form the stress relaxation portion R2 of the piezoelectric layer 42. In this case, the stress relaxation portion R2 of the piezoelectric layer 42 is greatly shrunk, and it is possible to pull the active portion R1 of the piezoelectric layer 42 to a greater extent. It is possible to greatly relax the compressive stress generated in the active portion R1 of the piezoelectric layer 42. When the polarization is effected with a small polarization voltage to form the active portion R1 of the piezoelectric layer 42, it is possible to decrease the degree of secular change of the piezoelectric characteristic of the active portion R1 of the piezoelectric layer 42. Further, the individual electrode 44 and the outer circumferential electrode 45 are in conduction. Therefore, for example, when any wiring line is constructed for the outer circumferential electrode 45 for applying the large polarization voltage beforehand, then the small polarization voltage can be applied to the outer circumferential electrode 45 in the second polarizing step, and the polarization voltage can be applied to the individual electrode 44. It is possible to simplify the arrangement of, for example, terminals and wiring lines.

Further, in the embodiment of the present teaching, the conductive paste material, which is provided to form the outer circumferential electrode 45, has the same blending ratio between the glass material and the metal particles as that of the conductive paste material which is provided to form the individual electrode 44. However, the glass material for the outer circumferential electrode 45 is blended with the metal particles having larger diameters (average particle size is several microns) as compared with the individual electrode 44. Further, the outer circumferential electrode 45 has the low dielectric layer 47 which makes contact with the piezoelectric layer 42. The present teaching is not limited thereto. For example, the outer circumferential electrode 45 may be formed of a conductive paste material in which the blending ratio of the metal particles is smaller than that of the individual electrode 44. Also in this case, as for the outer circumferential electrode 45, the blending ratio of the metal particles in the material is small, and hence the number of the metal particles to make contact with the piezoelectric layer 42 is decreased. In other words, the metal particles of the outer circumferential electrode 45, which are exposed to the surface to make contact with the piezoelectric layer 42 and which are brought in contact with the piezoelectric layer 42, have the number of particles per unit areal size which is smaller than that of the individual electrode 44. Therefore, large amounts of the glass material and the air are brought in contact with the contact interface of the piezoelectric layer 42 with respect to the outer circumferential electrode 45, and the contact areal size of the metal particles is decreased. Accordingly, it is possible to form the low dielectric layer 47 brought in contact with the piezoelectric layer 42. Further, in the present teaching, the conductive paste material, which is provided to form the electrodes including, for example, the individual electrode 44 and the outer circumferential electrode 47, is not limited to the conductive paste material in which the metal particles are blended in the glass material as described above. It is also possible to use, for example, a paste material including metal particles of Ag—Pd or the like, an inorganic binding material (binder) containing glass frit or bismuth oxide, and an organic vehicle containing an organic solvent (for example, terpineol and butylcarbitol) and a resin (for example, ethyl cellulose and polyvinyl acetate). In this case, the metal particles form the electrode itself, and the inorganic binding material allows the piezoelectric layer and the metal particles (electrode) to be in tight contact with each other. Further, the main role of the organic vehicle is to adjust the viscosity of the paste. When the electrode is formed by using the conductive paste material as described above, it is necessary to melt the inorganic binding material such as the glass frit in order to bring the piezoelectric layer and the metal particles in tight contact with each other. Therefore, it is necessary to perform the baking or calcination at a high temperature of about 500 to 600° C. In this situation, the organic material (or a part thereof) contained in the organic vehicle is vaporized (or sublimated). Therefore, it is possible to form the voids with ease.

The contact areal size between the metal particles and the piezoelectric layer 42 can be also decreased by roughening the surface roughness of the contact surface of the outer circumferential electrode 45 with respect to the piezoelectric layer 42. It is possible to form the low dielectric layer 47 brought in contact with the piezoelectric layer 42.

The embodiment of the present teaching has been explained as exemplified by the exemplary case in which the piezoelectric layers 41, 42 composed of the piezoelectric material and the plate composed of the metal material formed with the pressure chambers 10 of the channel unit 6 are joined to one another by using the thermosetting adhesive while being heated. In the embodiment described above, the piezoelectric layer 41 functions as the vibration plate. However, the present teaching is not limited to the construction or arrangement as described above. It is also allowable that the vibration plate may be formed by a metal plate composed of a metal material. In this case, when the metal plate and the piezoelectric layer 42 are heated and joined by using the thermosetting adhesive, the compressive stress in the in-plane direction remains in the piezoelectric layer 42 as described above. Even in the case of such a situation, it is possible to provide the effect to suppress the remaining compressive stress as described above by applying the present teaching. In the embodiment described above, the piezoelectric actuator 7 is joined to the channel unit 6. However, it is not necessarily indispensable that the piezoelectric actuator 7 should be joined to the channel unit 6. It is also allowable that the piezoelectric actuator 7 is joined to any other member, if necessary.

The direction of polarization (polarization direction) of the stress relaxation portion R2 may be the upward direction without being limited to the downward direction, provided that the direction of polarization (polarization direction) of the stress relaxation portion R2 resides in the direction of thickness (thickness direction) of the piezoelectric layer 42.

Figure 11:
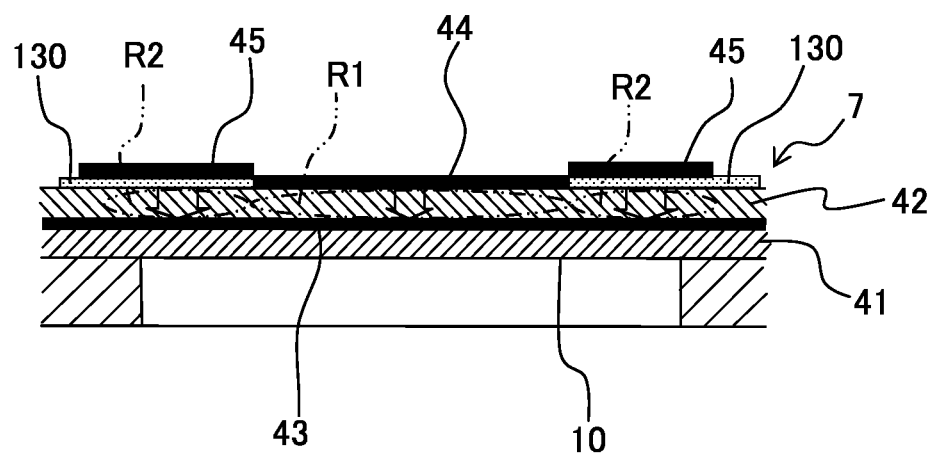
FIG. 11 shows a sectional view, of a modified embodiment, corresponding to FIG. 5A.

In the embodiment described above, the outer circumferential electrode 45 is formed of the conductive paste material which is blended with the metal particles having the diameters larger than those of the individual electrode 44. Accordingly, the low dielectric layer 47 (see FIG. 6B), which is composed of the insulating material and the air, is formed at the portion of the outer circumferential electrode 45 to make contact with the piezoelectric layer 42. However, the present teaching is not limited thereto, and it is possible to make any appropriate change, if necessary. For example, as shown in FIG. 11, it is also allowable that an insulating film 130 is formed at a portion of the piezoelectric layer 42 at which the outer circumferential electrode 45 is formed, and the outer circumferential electrode 45 is formed by using the same conductive paste material as that used for the individual electrode 44 on a surface of the insulating film 130 disposed on the side opposite to the piezoelectric layer 42. In this case, the outer circumferential electrode 45 is formed by using the same conductive paste material as that used to form the individual electrode 44. Therefore, any low dielectric layer, which is composed of the insulating material and the air, cannot be formed to have a sufficient thickness between the outer circumferential electrode 45 and the piezoelectric layer 42. However, the insulating film 130 intervenes between the outer circumferential electrode 45 and the piezoelectric layer 42, which can function in the same manner as the low dielectric layer 47 described above. Specifically, the individual electrode 44 and the outer circumferential electrode 45 are in conduction with each other. Therefore, even when any special wiring line is not prepared, the driving voltage can be also applied to the outer circumferential electrode 45 simultaneously when the driving voltage is applied to the individual electrode 44. In this arrangement, the insulating film 130, which functions in the same manner as the low dielectric layer 47, is arranged between the outer circumferential electrode 45 and the piezoelectric layer 42. Therefore, the driving voltage is concentrated on the insulating film 130 during the application of the driving voltage. Therefore, the voltage is scarcely applied to the stress relaxation portion R2 of the piezoelectric layer 42. As a result, the piezoelectric deformation of the stress relaxation portion R2 of the piezoelectric layer 42 is decreased, and the piezoelectric deformation of the active portion R1 of the piezoelectric layer 42 is hardly inhibited. On the other hand, during the polarization, it is possible to apply the electric field to both of the active portion R1 and the stress relaxation portion R2. It is not necessarily indispensable that the outer circumferential electrode 45 should be formed by using the same conductive paste material as that used to form the individual electrode 44. The conductive paste material may be appropriately changed, if necessary.

The explanation has been made above about the exemplary case in which the present teaching is applied to the piezoelectric actuator of the ink jet head for jetting the ink from the nozzles. However, there is no limitation thereto. It is also possible to apply the present teaching to any piezoelectric actuator having the individual electrode and the outer circumferential electrode to be used for various apparatuses other than the ink jet head, and any liquid transport apparatus having such a piezoelectric actuator.

What is claimed is:
1. A piezoelectric actuator which is joined to a joining member, comprising:

a piezoelectric layer which is joined to the joining member and which has a coefficient of linear expansion smaller than a coefficient of linear expansion of the joining member;

a first electrode which is arranged on one surface of the piezoelectric layer;

a second electrode which is arranged on a portion of the one surface of the piezoelectric layer different from the first electrode and which is in conduction with the first electrode; and a low dielectric layer which is formed between the piezoelectric layer and the second electrode and which has a dielectric constant lower than a dielectric constant of the piezoelectric layer.

2. The piezoelectric actuator according to claim 1, wherein each of the first electrode and the second electrode is formed of a material comprising metal particles contained in an insulating material; and the second electrode is formed of the material in which diameters of the metal particles are larger than those of the first electrode.

3. The piezoelectric actuator according to claim 1, wherein each of the first electrode and the second electrode contains metal particles; and an average diameter of the metal particles contained in the second electrode is larger than an average diameter of the metal particles contained in the first electrode.

4. The piezoelectric actuator according to claim 1, wherein each of the first electrode and the second electrode is formed of a material comprising metal particles contained in an insulating material; and the second electrode is formed of the material in which a blending ratio of the metal particles with respect to the material is smaller than that of the first electrode.

5. The piezoelectric actuator according to claim 1, wherein each of the first electrode and the second electrode contains metal particles; and a number of the metal particles exposed to a surface facing the piezoelectric layer per unit areal size of the second electrode is smaller than a number of the metal particles exposed to a surface facing the piezoelectric layer per unit areal size of the first electrode.

6. The piezoelectric actuator according to claim 1, wherein the second electrode has areas arranged on both sides of the first electrode in relation to one direction parallel to an in-plane direction of the piezoelectric layer.

7. The piezoelectric actuator according to claim 6, wherein the second electrode is arranged to surround the first electrode.

8. The piezoelectric actuator according to claim 7, wherein the joining member includes a base member which is formed with a deformation permitting portion which is configured to permit deformation of the piezoelectric layer;

the piezoelectric actuator has a vibration plate which is stacked with the piezoelectric layer and which is arranged on one surface of the base member;

the vibration plate is joined to a circumferential area of the deformation permitting portion of the base member in a state of covering the deformation permitting portion of the base member;

the first electrode is arranged on the one surface of the piezoelectric layer at an area facing the deformation permitting portion; and the second electrode is arranged in an area facing the deformation permitting portion to surround the first electrode.

9. The piezoelectric actuator according to claim 7, wherein the joining member includes a base member which is formed with a deformation permitting portion which is configured to permit deformation of the piezoelectric layer;

the piezoelectric actuator has a vibration plate which is stacked with the piezoelectric layer and which is arranged on one surface of the base member;

the vibration plate is joined to a circumferential area of the deformation permitting portion of the base member in a state of covering the deformation permitting portion of the base member;

the first electrode is arranged on the one surface of the piezoelectric layer at an area facing the deformation permitting portion; and the second electrode is arranged on the one surface of the piezoelectric layer to surround an area facing the deformation permitting portion.

10. The piezoelectric actuator according to claim 8, wherein the piezoelectric actuator is constructed so that the piezoelectric actuator is connected to a wiring member on the one surface of the piezoelectric layer, and the piezoelectric actuator further comprises:

a leading electrode which is arranged on the one surface of the piezoelectric layer, which is led from the first electrode, and which extends to an area not facing the deformation permitting portion; and a connecting terminal which is formed in an area of the leading electrode not facing the deformation permitting portion and which is connected to the wiring member.

11. The piezoelectric actuator according to claim 9, wherein the piezoelectric actuator is constructed so that the piezoelectric actuator is connected to a wiring member on the one surface of the piezoelectric layer, and the piezoelectric actuator further comprises:

a leading electrode which is arranged on the one surface of the piezoelectric layer, which is led from the first electrode, and which extends to an area not facing the deformation permitting portion; and a connecting terminal which is formed in an area of the leading electrode not facing the deformation permitting portion and which is connected to the wiring member.

12. The piezoelectric actuator according to claim 8, wherein the piezoelectric actuator is constructed so that a wiring member is connected on the one surface of the piezoelectric layer, and the piezoelectric actuator further comprises:

a common electrode which is arranged, on the other surface disposed on a side opposite to the one surface of the piezoelectric layer, to face the first electrode and the second electrode commonly;

a surface electrode which is arranged to face the common electrode at a portion of the one surface of the piezoelectric layer different from the first electrode and the second electrode and which is formed of the same material as that of the second electrode; and a connecting terminal which is formed on each of the second electrode and the surface electrode and which is connected to the wiring member, wherein a through-hole, which penetrates in a thickness direction and in which a conductive material is filled, is formed at a portion of the piezoelectric layer at which the common electrode and the surface electrode face one another.

13. The piezoelectric actuator according to claim 9, wherein the piezoelectric actuator is constructed so that a wiring member is connected on the one surface of the piezoelectric layer, and the piezoelectric actuator further comprises:

a common electrode which is arranged, on the other surface disposed on a side opposite to the one surface of the piezoelectric layer, to face the first electrode and the second electrode commonly;

a surface electrode which is arranged to face the common electrode at a portion of the one surface of the piezoelectric layer different from the first electrode and the second electrode and which is formed of the same material as that of the second electrode; and a connecting terminal which is formed on each of the second electrode and the surface electrode and which is connected to the wiring member, and wherein:

a through-hole, which penetrates in a thickness direction and which is filled with a conductive material, is formed at a portion of the piezoelectric layer at which the common electrode and the surface electrode are facing one another.

14. A liquid transport apparatus which transports a liquid, comprising:

a channel unit in which a liquid channel including a pressure chamber is formed;

a piezoelectric actuator which is arranged on the channel unit and which applies a pressure to the liquid in the pressure chamber; and a joining member to which the piezoelectric actuator is joined, wherein the piezoelectric actuator comprises:

a piezoelectric layer which has a coefficient of linear expansion smaller than a coefficient of linear expansion of the joining member and which is joined to the joining member;

a first electrode which is arranged on one surface of the piezoelectric layer at an area facing the pressure chamber;

a second electrode which is arranged on a portion of the one surface of the piezoelectric layer different from the first electrode, which is formed of a material different from that of the first electrode, and which is in conduction with the first electrode; and a low dielectric layer which is formed between the piezoelectric layer and the second electrode and which has a dielectric constant lower than that of the piezoelectric layer.

* * * * *